(12) United States Patent
Borger et al.

(10) Patent No.: US 7,009,272 B2
(45) Date of Patent: Mar. 7, 2006

(54) PECVD AIR GAP INTEGRATION

(75) Inventors: Wilmer F. Borger, Beaverton, OR (US); Jeffrey T. West, Tigard, OR (US); Ebrahim Andideh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 64 days.

(21) Appl. No.: 10/334,195

(22) Filed: Dec. 28, 2002

(65) Prior Publication Data

US 2004/0124446 A1    Jul. 1, 2004

(51) Int. Cl.
  *H01L 29/00* (2006.01)
  *H01L 23/48* (2006.01)
(52) U.S. Cl. ................................ 257/522; 257/773
(58) Field of Classification Search ............... 257/522, 257/773
See application file for complete search history.

(56) References Cited

U.S. PATENT DOCUMENTS

| | | | | |
|---|---|---|---|---|
| 5,476,817 A | * | 12/1995 | Numata | 438/619 |
| 5,512,775 A | * | 4/1996 | Cho | 257/522 |
| 5,863,832 A | * | 1/1999 | Doyle et al. | 438/622 |
| 6,091,149 A | * | 7/2000 | Hause et al. | 257/758 |
| 6,303,487 B1 | * | 10/2001 | Kagamihara | 438/619 |
| 6,376,330 B1 | * | 4/2002 | Fulford et al. | 438/421 |
| 6,762,120 B1 | * | 7/2004 | Nakagawa et al. | 438/619 |

* cited by examiner

*Primary Examiner*—Hung Vu
(74) *Attorney, Agent, or Firm*—Michael D. Plimier

(57) ABSTRACT

A series of conductive layers separated by interlayer gaps is formed adjacent a substrate layer, the conductive layer and interlayer gap dimensions defining aspect ratios for trenches between the conductive layers. A layer of dielectric material is deposited over the conductive layers using plasma enhanced chemical vapor deposition. Trenches having aspect ratios within specified geometric categories are incompletely filled, leaving interlayer voids which may have desirable dielectric properties.

16 Claims, 7 Drawing Sheets

PECVD AIR GAP INTEGRATION

BACKGROUND OF THE INVENTION

Low dielectric constant materials are used as interlayer dielectrics in microelectronic devices, such as semiconductor devices, to reduce the RC delay and improve device performance. As device sizes continue to shrink, the dielectric constant of the material between metal layers must also decrease to maintain the improvement. Certain low-k materials have been proposed, including various carbon-containing materials such as organic polymers and carbon-doped oxides. Although such materials may serve to lower the dielectric constant, they may offer inferior mechanical properties such as poor strength and low fracture toughness. The eventual limit for a dielectric constant is k=1, which is the value for a vacuum. Methods and structures have been proposed to incorporate void spaces or "air gaps" in attempts to obtain dielectric constants closer to k=1. Some of the suggested solutions incorporate sacrificial materials which are removed subsequent to certain steps within a process integration. Removing sacrificial material generally requires extra steps and expense, and also may require undesirable temperature or solvent exposures associated with the removal of sacrificial material.

Accordingly, there is a need for a microelectronic device structure incorporating air gaps which has low-k dielectric properties and can be fabricated efficiently with minimized disruption of adjacent structures.

BRIEF DESCRIPTION OF THE DRAWINGS

The present invention is illustrated by way of example and is not limited in the figures of the accompanying drawings, in which like references indicate similar elements. Features shown in the drawings are not intended to be drawn to scale, nor are they intended to be shown in precise positional relationship.

DETAILED DESCRIPTION

In the following detailed description of embodiments of the invention, reference is made to the accompanying drawings in which like references indicate similar elements. The illustrative embodiments described herein are disclosed in sufficient detail to enable those skilled in the art to practice the invention. The following detailed description is therefore not to be taken in a limiting sense, and the scope of the invention is defined only by the appended claims.

Figure 1A:
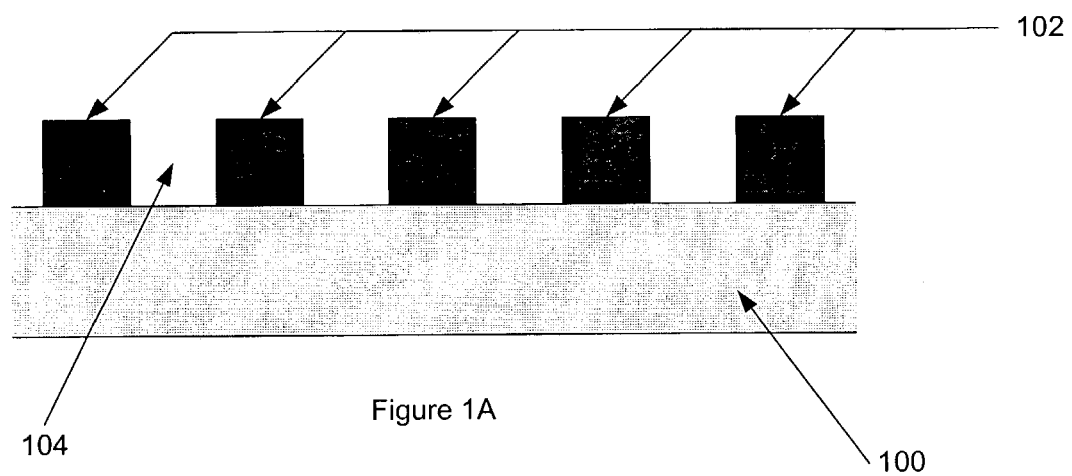
FIGS. 1A–1B depict cross-sectional views of various aspects of one embodiment of the present invention.
Figure 1B:
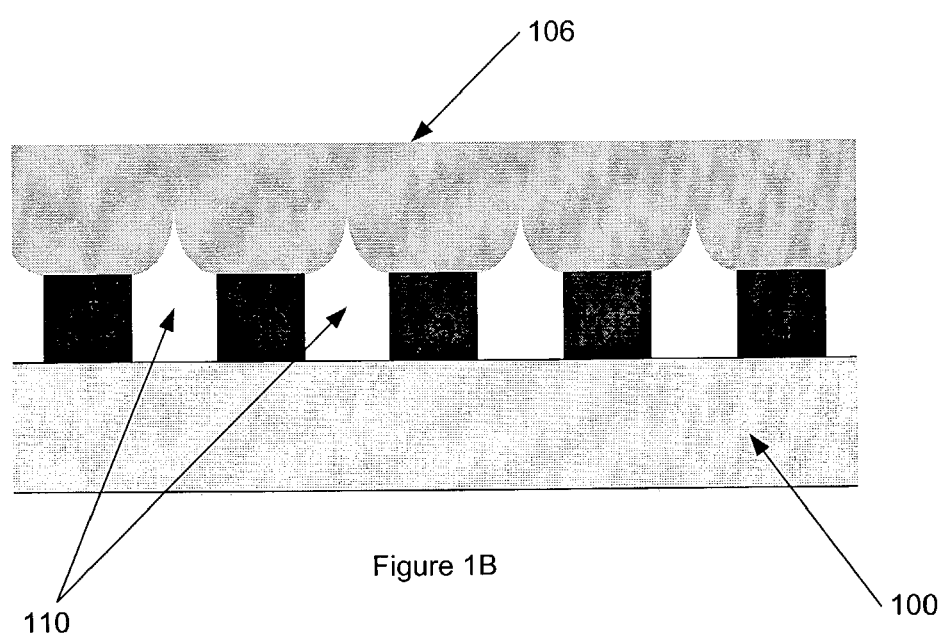

Referring to FIGS. 1A and 1B, a transformation in accordance with one embodiment of the present invention is depicted. In such embodiment, a series of conductive layers (102) is positioned upon a substrate layer (100). Between each of sets of adjacent conductive layers is a trench (104) defined by the sides of the conductive layers (102) and the substrate layer (100). Given the appropriate trench (104) dimensions, a dielectric layer (106) such as that depicted in FIG. 1B may be formed adjacent the conductive layers in a manner wherein voids (110) are confined between the conductive layers, the voids (110) providing desirable dielectric properties for the positions between adjacent conductive layers. As is described in further detail below, plasma enhanced chemical vapor deposition ("PECVD") may be employed to create such a dielectric layer (106) using conventional equipment and a minimal number of added process tasks.

Figure 2:
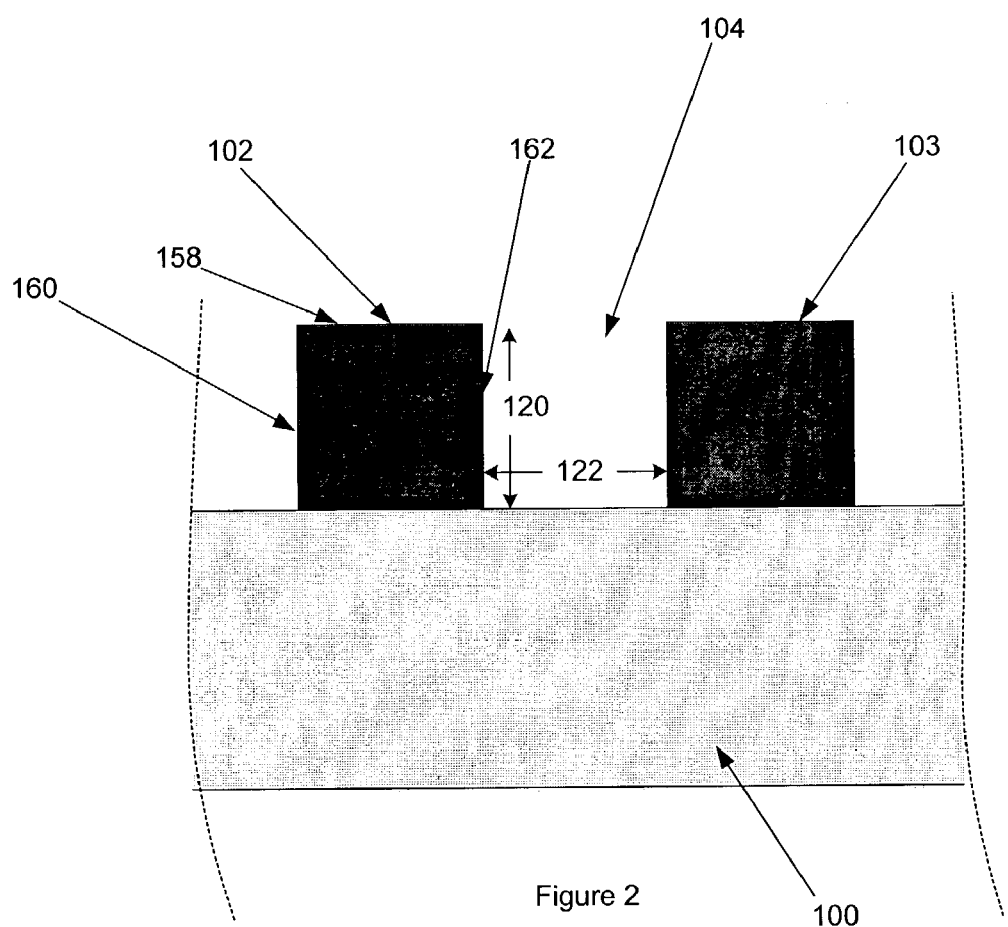
FIG. 2 depicts an enlarged cross-sectional view of various aspects of one embodiment of the present invention.

Two geometric constraints important to successful transformation to a structure such as that of FIG. 1B are aspect ratio and interlayer gap, both of which are associated with the size and relative positioning of conductive layers. As illustrated in FIG. 2, two adjacent conductive layers (102, 103) are depicted in close-up cross-sectional view. Each of the two conductive layers (102, 103) in the depicted embodiment has a substantially rectangular cross sectional profile, defined, in reference to the leftmost depicted conductive layer (102), by the substrate layer (100), a top (158), and two sides (160, 162), the sides extending substantially perpendicularly from the substrate by a side height (120) dimension. The two conductive layers in the illustrated embodiment are separated from each other by a trench (104), the width of which is defined by an "interlayer gap" (122) dimension. The "aspect ratio" of the trench (104) is defined as the conductive layer height (120) divided by the interlayer gap (122). For example, if the interlayer gap (122) is equal in distance to the conductive layer height (120), the pertinent trench (104) has an aspect ratio of 1.0. As discussed in further detail below, aspect ratio and interlayer gap are important variables in successfully transforming, for example, a structure such as that of FIG. 1A to a structure such as that of FIG. 1B with an efficient PECVD application. Structures such as those shown in enlarged form in FIG. 2 may be formed using conventional techniques such as those described in reference to FIGS. 3A–3C.

Figure 3A:
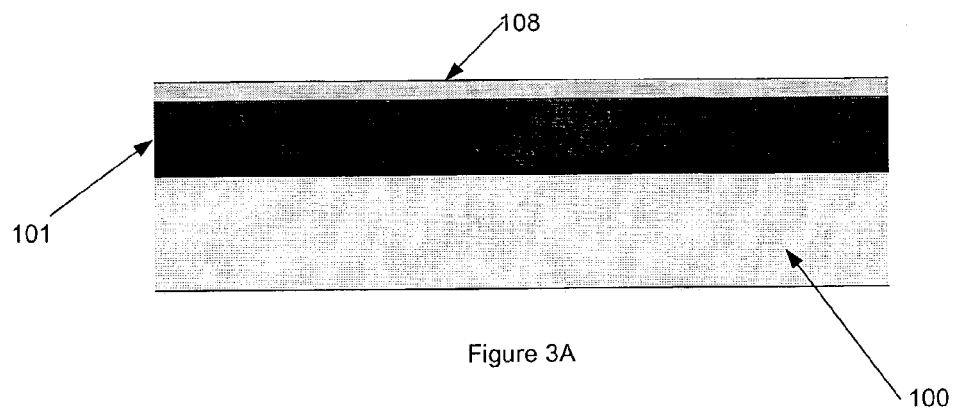
FIGS. 3A–3F depict cross-sectional views of various aspects of one embodiment of the present invention.
Figure 3B:
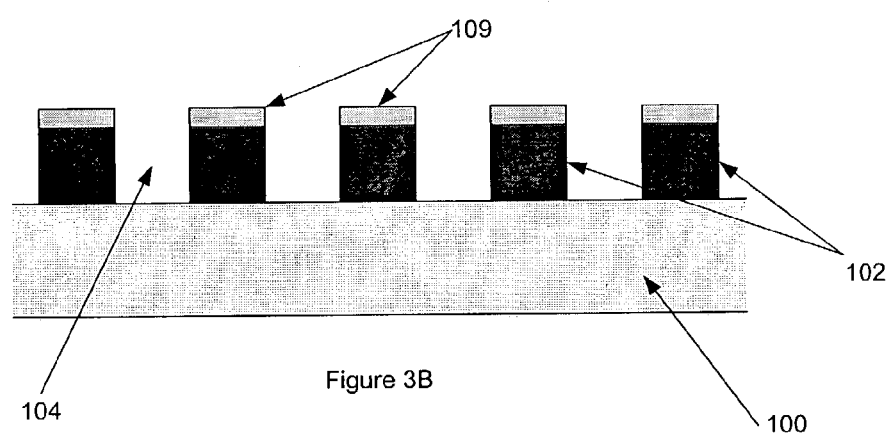

Referring to FIG. 3A, a substrate layer (100) is depicted, adjacent to which a conductive layer (101) and photoresist layer (108) have been deposited. The substrate layer (100) may be any surface generated when making an integrated circuit, upon which a conductive layer may be formed. The substrate layer (100) thus may comprise, for example, active and passive devices that are formed on a silicon wafer, such as transistors, capacitors, resistors, diffused junctions, gate electrodes, local interconnects, etcetera. The substrate layer (100) may also comprise insulating materials (e.g., silicon dioxide, either undoped or doped with phosphorus or boron and phosphorus; silicon nitride; silicon oxynitride; or a polymer) that separate active and passive devices from the conductive layer or layers that are formed adjacent them, and may comprise other previously formed conductive layers.

Figure 3C:
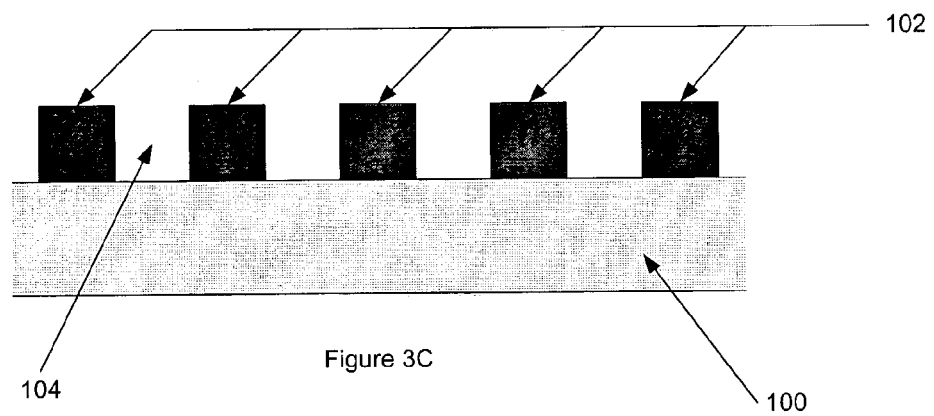

To form discrete conductive layers (102) such as those depicted in FIGS. 1A–1B and 2, several conventional techniques may be applied. The illustrated embodiment utilizes techniques known as "subtractive" techniques, wherein a broad, oversized layer of conductive material is deposited, and then selectively removed using conventional patterning and etching treatments, to form discrete conductive layers with trenches between the conductive layers. The depicted conductive layer (101), comprising materials conventionally used to form conductive layers in integrated circuits, and preferably comprising metals such as copper, titanium, aluminum, and alloys thereof, may be formed using conventional techniques such as physical vapor deposition or chemical vapor deposition. The continuous photoresist layer (108) depicted in FIG. 3A may be patterned and developed to form discrete photoresist portions (109) between which etchants may access the conductive layer (101) to define the trenches (104) and discrete conductive layers (102) as depicted in FIG. 3C. As would be apparent to one skilled in the art, other conventional techniques such as electroplating, may be utilized to produce structures similar to that depicted in FIG. 3C. For example, damascene techniques may be applied, wherein trenches are formed within a sacrificial layer and filled with conductive material using electroplating, subsequent to which the sacrificial material is removed, leaving behind a structure similar to that depicted in FIG. 3C. Planarizaton using conventional techniques such as chemical mechanical planarization ("CMP") may be interjected into such formation schemas to provide better height and top flatness uniformity among the discrete conductive layers (102). For example, in a subtractive schema, the continuous conductive layer (101) may be planarized subsequent to deposition of the conductive material, or subsequent to removal of the discrete photoresist portions (109). In an electroplating schema, planarization may be applied after electroplating to not only provide height and flatness uniformity, but also to prevent shorts between adjacent discrete conductive layers (102). A thin layer of dielectric material (not shown), such as silicon nitride, may be deposited between the conductive layer (101) and substrate layer (100) of FIG. 3A, or in the case of an electroplating schema, between the sacrificial layer and substrate layer, to provide etch stop functionality minimizing the risk of overetching through the conductive layer (101) and into the substrate layer (100), as would be apparent to one skilled in the art. Subject to geometric and materials requirements as discussed in further detail below, the structure of FIG. 3C may be further processed to form interlayer air gaps or voids, as shown in FIG. 1A.

Figure 3D:
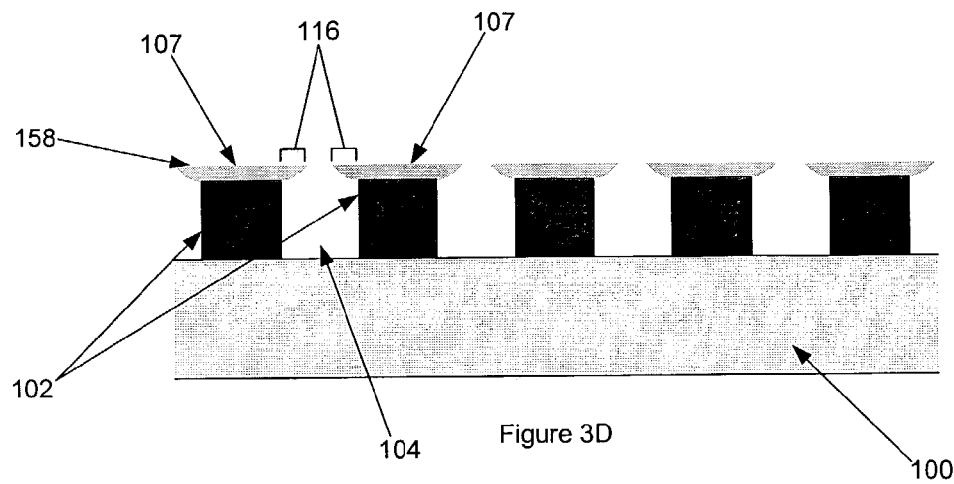
Figure 3E:
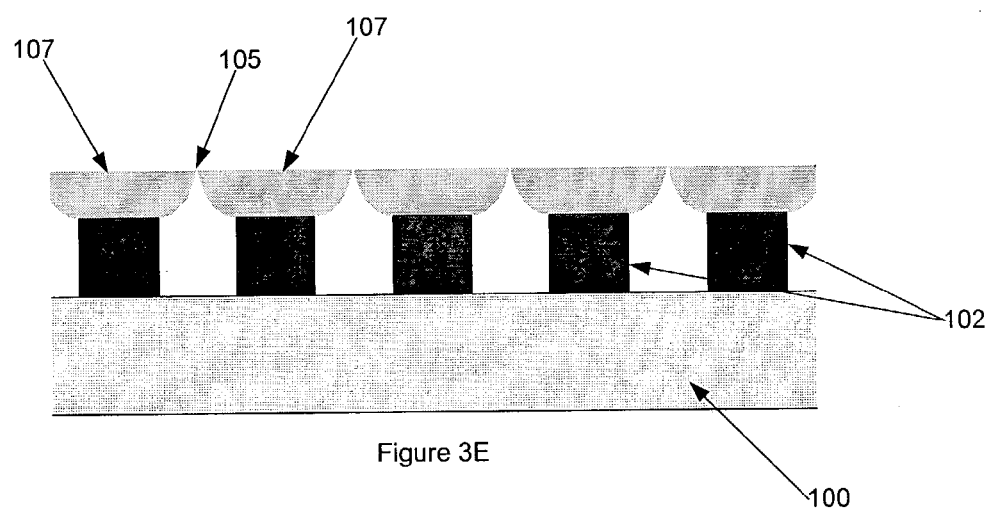
Figure 3F:
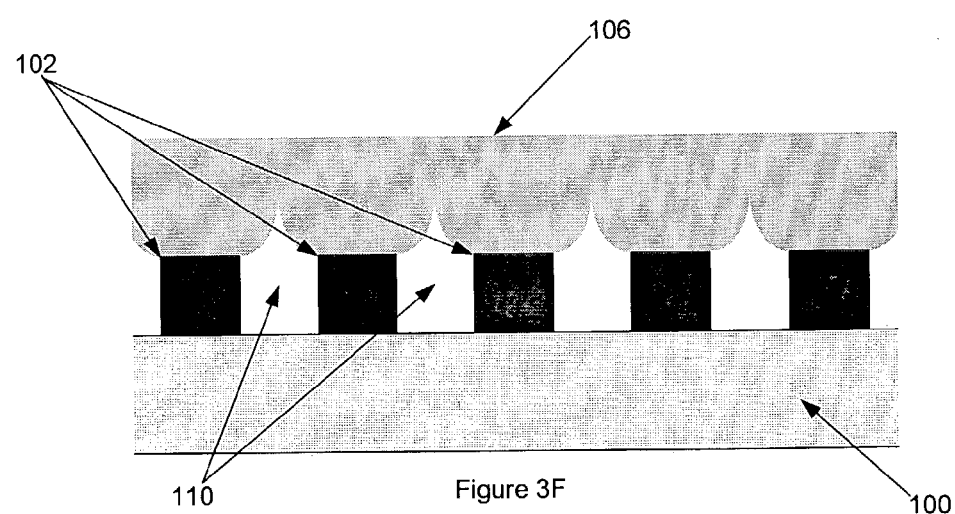

FIG. 3D depicts PECVD deposition commenced upon the conductive layers (102), to form thin, unconnected dielectric layers (107) upon the tops (158) of the conductive layers (102). Due to the conductivity patterns within the conductive layers (102) during PECVD, the thin dielectric films (107) are deposited in a manner wherein they not only project perpendicularly from the tops (158) of the conductive layers (102), but also to the sides, forming end portions (116) which overhang adjacent nearby trenches (104), as shown in FIG. 3D. The dielectric films (107) preferably comprise conventional ceramics or amorphous glasses utilized in semiconductor or other microelectronic applications, such as silicon dioxide or silicon oxynitride, which are deposited using specific precursor gases, such as silane, in the PECVD process, as described in further detail below. As depicted in FIG. 3E, continued deposition by PECVD adds more dielectric material to the discrete layers (107), eventually resulting in an apex joint (105) between conductive layers (102), at which adjacent discrete dielectric layers (107) intersect, thereafter functioning as a single layer which covers the trench below, transforming the trench into a void which is at least partially defined by the dielectric layer. As shown in FIG. 3F, the completed dielectric layer (106) partially defines a series of voids (110) as it defines a bridge-like formation over them, the remainder of each void defined, in the depicted embodiment, by the substrate layer (100) and the associated contact layer (102) sidewalls.

Figure 4:
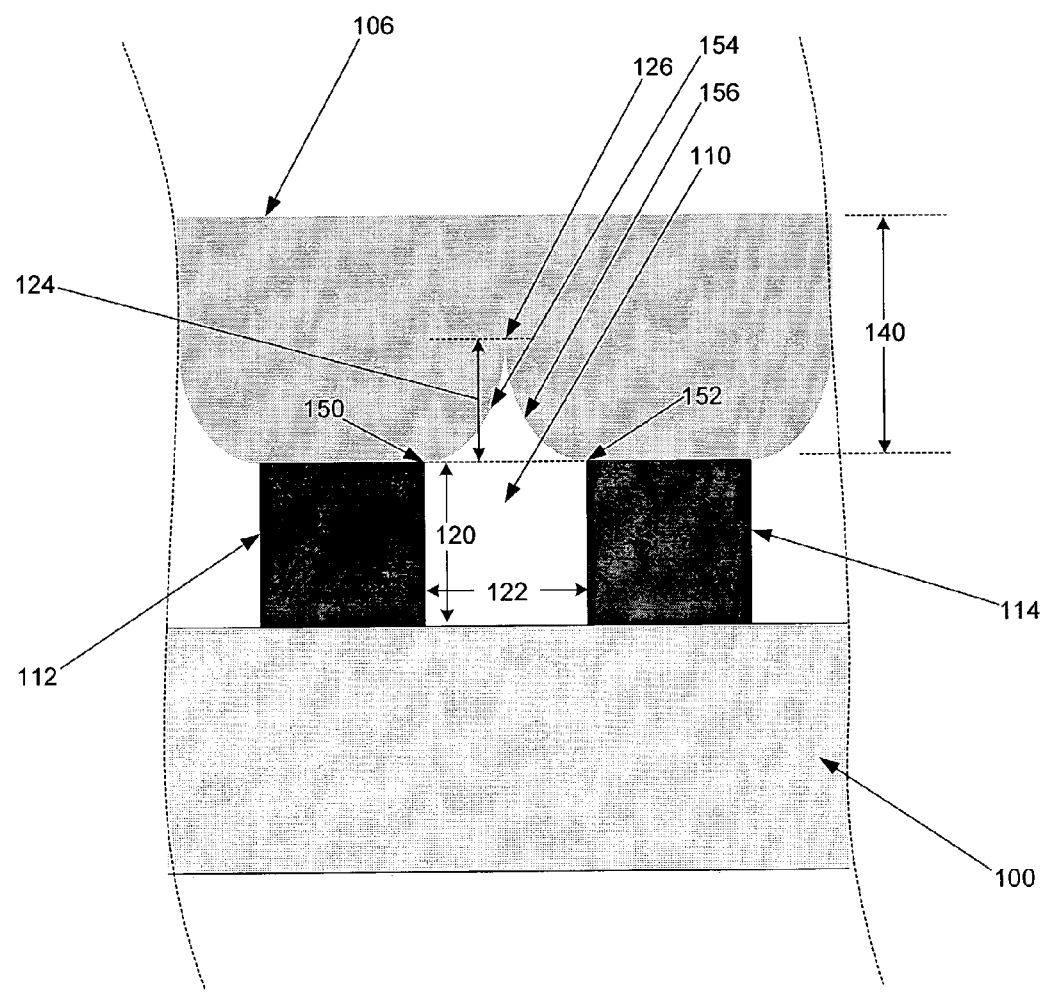
FIG. 4 depicts an enlarged cross-sectional view of various aspects of one embodiment of the present invention.
Figure 5:
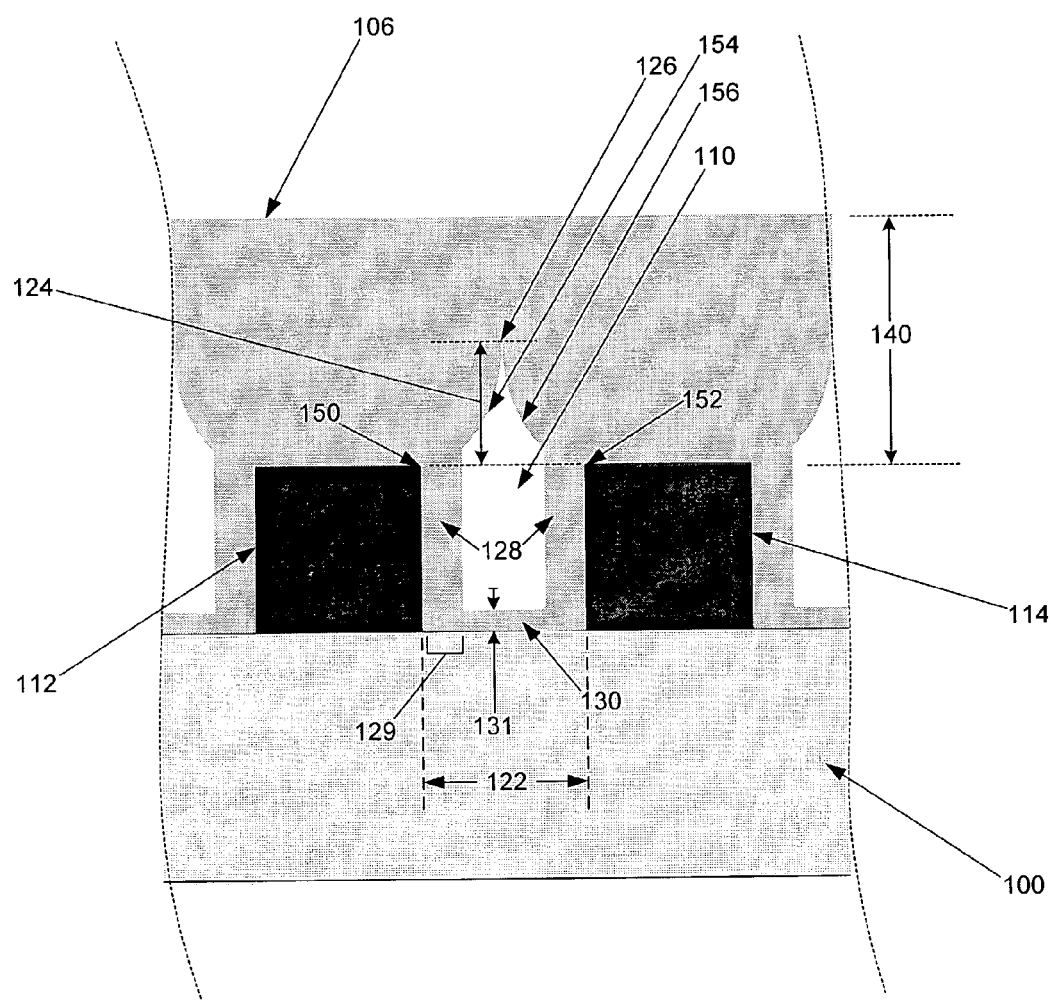
FIG. 5 depicts an enlarged cross-sectional view of various aspects of one embodiment of the present invention.

FIGS. 4 and 5 depict enlarged cross-sectional views of two embodiments of the invention which may be used to further illustrate pertinent details of the inventive method and structure.

Referring to FIG. 4, an enlarged cross-sectional view of one embodiment is depicted. The first and second adjacent conductive layers (112, and 114, respectively) have substantially rectangular cross sections with substantially uniform conductive layer heights (120) and an interlayer gap (122) positioned between them. In this embodiment, the conductive layers preferably comprise aluminum formed upon a substrate, preferably comprising silicon, using subtractive techniques as described above. The interlayer gap (122) may be less than about 0.50 microns, and preferably is between 50 and 250 nanometers, as may be dictated by critical dimension design characteristics pertinent to the overall microelectronic structure. In the depicted embodiment, the interlayer gap (122) is about 250 nanometers. As discussed above, the interlayer gap (122) and conductive layer heights (120) define an aspect ratio for the associated trench which preferably is greater than about 1.0. In other words, the conductive layer heights (120) are preferably at least as large as the interlayer gap (122) with which they are associated. The depicted embodiment has an aspect ratio of about 3.0, meaning that the conductive layer height (120) in the depicted embodiment is about 750 nanometers.

As shown in FIG. 4, a dielectric layer (106) is deposited adjacent the conductive layers (112, 114) and across the trench to form a void (110), the void being defined by the dielectric layer (106) at the top, the conductive layers (112, 114) at the sides, and the substrate layer (100) at the bottom. The depicted void (110) is cross-sectionally encapsulated by the dielectric layer (106), the conductive layers (112, 114), and the substrate layer (100). The portion of the dielectric layer (106) that defines the top of the void (110) has an apex point or void apex (126), at which two substantially convex surfaces (154, 156) of the dielectric layer (106) meet. In the depicted embodiment, wherein the conductive layers (112, 114) have substantially equivalent geometries, the void apex (126) and the upper corners (150, 152) of the conductive layers (112, 114) become positioned approximately equidistant from each other, such that the straight-line distances from the left depicted corner (150) to the void apex (126), and from the right depicted corner distance to the void apex (126), are approximately the same distance as the interlayer gap (122). Given this relationship, simple equilateral triangular geometry dictates that height difference (124) between the void apex (126) and the conductive layers (112, 114) is about 0.87 times the interlayer gap (122) distance, or about 215 nanometers in the illustrative embodiment. With a nonzero void apex (126) height (124), as in the embodiments described herein, the void apex (126) is positioned farther from the substrate layer (100) than any portion of the depicted conductive layers (112, 114). It may be desirable to deposit a dielectric layer having mechanical rigidity or the ability to withstand cyclic mechanical loads, such as those which may be applied during chemical mechanical polishing. In such cases, a dielectric layer (106) having a thickness (140) enough to substantially cover over the void apex (126) is desired. In the depicted embodiment, for example, the dielectric layer has a thickness about two times the higher than the void apex (126) is positioned above the conductive layers (112, 114), or about 440 nanometers thick. The dielectric layer preferably comprises a ceramic or amorphous glass dielectric material, such as silicon oxynitride, silicon dioxide, and silicon nitride, which is deposited by PECVD using specific precursors. Besides precursor gas selection and relative flow rates, other processing variables include RF power for the PECVD plasma, electrode spacing, pressure, and temperature. As would be apparent to one skilled in the art, the processing temperature is a function of the material to be deposited. For example, relatively high temperatures are required to deposit silicon nitride using PECVD, as opposed to silicon oxynitride. In the depicted embodiment, the dielectric layer (106) preferably comprises silicon oxynitride, the RF power preferably is between about 100 watts and about 700 watts at 13.56 kilohertz, the electrode spacing is preferably between about 300 mils and about 600 mils, the pressure preferably is between about 1 Torr and about 10 Torr and more preferably between about 2 Torr and about 7 Torr, and the temperature preferably is between about 100 degrees and about 140 degrees, Celsius. A preferred precursor gas mix comprising, by relative flow rate, about 1.2% silane, 0.4% nitrous oxide, 2.5% ammonia, and about 95.9% nitrogen gas, at a total flow rate of about 5,000 standard cubic centimeters per minute ("sccm"), provides a deposition as depicted at a rate of about 70 angstroms per second using a conventional PECVD apparatus such as that distributed under the trade name "AMAT 5000™", distributed by Applied Materials Corporation. The relatively low process temperatures and flexibility with pressure and other variables in such an embodiment make silicon oxynitride a highly preferred material. Data from experiments using silicon oxynitride as a dielectric layer (106) material and variations of the above process variables dictates that increasing the RF power yields apexes higher by about 10% to about 25% from the aforementioned equilateral triangle relationship, and sidewall portions which are thinner by about 10% to about 25%, as described in reference to FIG. 5.

Referring to FIG. 5, an embodiment related to that described in reference to FIG. 4 is depicted, this embodiment having an aspect ratio which is between 1.0 and 3.0, and preferably about 1.5, with the same interlayer gap (122) as the embodiment of FIG. 4, about 250 nanometers, meaning that the conductive layers (112, 114) preferably have a height of about 370 nanometers. To illustrate the significance of aspect ratio, all other process variables for the illustrative embodiment of FIG. 5 are the same as those for an embodiment such as that depicted in FIG. 4. The resulting structures in this embodiment are quite similar to those of the embodiment of FIG. 4, with the exception that the trench and subsequent void (110) is lined by dielectric material which forms sidewall portions (128) and a substrate portion (130). In the embodiment of FIG. 5, the dielectric material comprising the dielectric layer (106), sidewall portions (128), and substrate portion (130) effectively cross-sectionally encapsulates the void (110). The aforementioned equilateral triangular relationship between the conductive layer corners (150, 152) and the void apex (126) remains substantially intact, as does the convex curvature of the dielectric layer surfaces (154, 156) which meet at the void apex (126). The thickness (129) of the sidewall portions (128), and the thickness (131) of the substrate portion (130), about ¼ and ⅕ of the interlayer gap distance, respectively, in the depicted embodiment, are most dramatically adjusted using the aspect ratio variable, but may also be controlled using process variables such as RF power. For example, using substantially the same settings as those described above in relation to FIGS. 4 and 5, with the exception of an aspect ratio of about 1.0, a smaller void (110) will remain, due primarily to sidewall portions (128) each having thickness (129) encroaching upon half the interlayer gap distance, and substrate portions encroaching upon about ½ of the height of the conductive layers. Further, using the same variables and an aspect ratio around 0.75, no substantial void remains, the trenches being filled with dielectric material. As mentioned above, the void apex (126) position and sidewall portion (128) thickness (129) may be adjusted with increased RF power. For example, an increase from about 100 watts to about 700 watts results in a sidewall portion (128) thickness (129) decrease of about 10–25%, and an increase in void apex (126) height (124) of about 10–25%. As illustrated in FIGS. 4 and 5, the void (110) continuously transects substantially all of the space between the two conductive layers (112, 114), providing the opportunity for significant electrical isolation, as is desirable in many microelectronic devices, such as semiconductor interconnects. Should a void (110) which completely transects the space between adjacent conductive layers be desired, as in the case of the embodiment of FIG. 4, conductive layers may be positioned and sized relatively with an aspect ratio of over 2.0, and preferably over 3.0, and subjected to PECVD using process variables such as those described herein to yield structures similar to that depicted in FIG. 4.

Figure 6A:
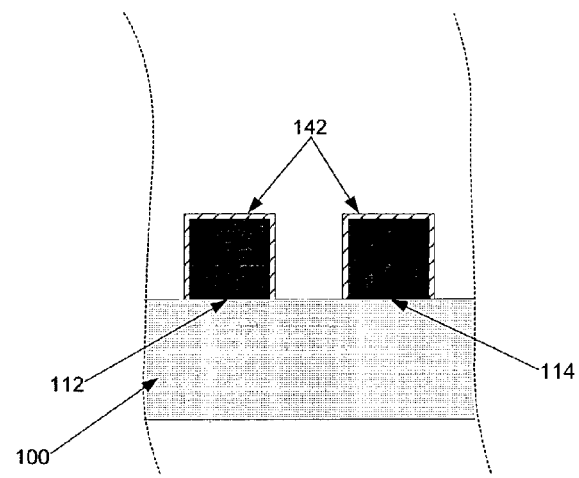
FIGS. 6A–6C depict enlarged cross-sectional views of various aspects of one embodiment of the present invention.
Figures 6B, 6C:
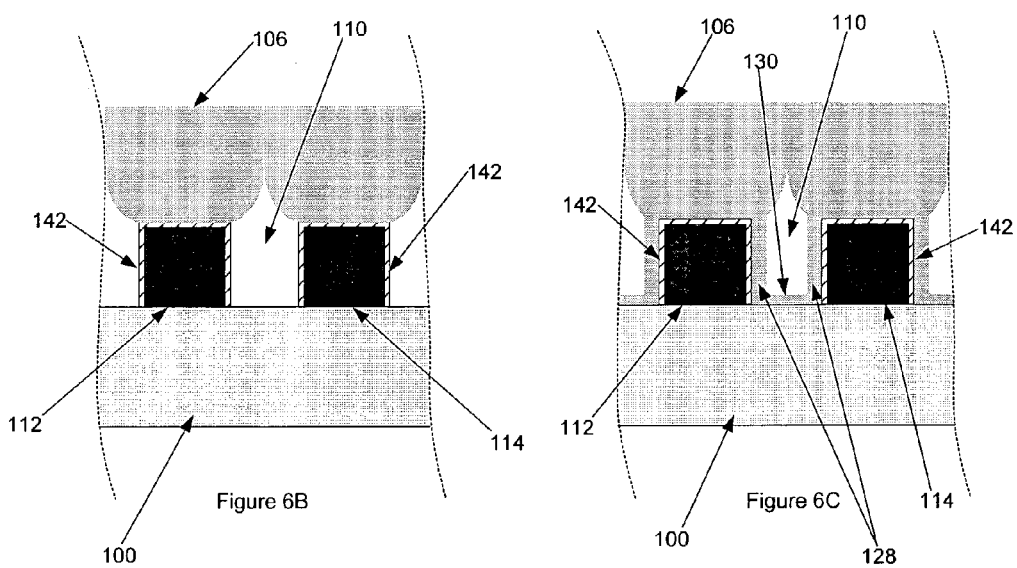

Referring to FIGS. 6A–6C, an embodiment is depicted wherein an isolation layer (142) is formed around the exposed surfaces of the conductive layers (112, 114) before formation of the dielectric layer (106). FIG. 6A illustrates a cross sectional view wherein two adjacent conductive layers (112, 114) have been formed, using techniques such as those described above in reference to FIGS. 3A–3C, and subsequently an isolation layer (142) has been deposited upon the exposed portions of the conductive layers (112, 114). The isolation layer (142), preferably between about 10 nanometers and about 200 nanometers in thickness, may be utilized to further isolate conductive and reactive materials comprising the conductive layers (112, 114), such as aluminum or copper. The isolation layer (142) may comprise insulative materials such as tetraethyl orthosilicate ("TEOS")-based silicon dioxide, formed using conventional techniques such as CVD or PECVD. Referring to FIG. 6B, an analog to the embodiment of FIG. 4 is depicted, with the exception that the embodiment of FIG. 6B has an isolation layer (142) integrated upon each conductive layer (112, 114). With a silicon dioxide isolation layer (142) between about 100 nanometers and about 200 nanometers in thickness, formation of the dielectric layer (106) proceeds as described above subsequent to formation of the isolation layer (142), resulting in a void (110) of slightly decreased size due to presence of the isolation layer (142). Referring to FIG. 6C, an analog to the embodiment of FIG. 5 is depicted, with the exception that the embodiment of FIG. 6C has an isolation layer (142) integrated upon each conductive layer (112, 114). With a silicon dioxide isolation layer (142) between about 100 nanometers and about 200 nanometers in thickness, formation of the dielectric layer (106), including sidewall portions (128) and substrate portion (130) proceeds as described above subsequent to formation of the isolation layer (142), resulting in a void (110) of slightly decreased size.

Thus, a novel dielectric processing solution is disclosed. Although the invention is described herein with reference to specific embodiments, many modifications therein will readily occur to those of ordinary skill in the art. Accordingly, all such variations and modifications are included within the intended scope of the invention as defined by the following claims.

What is claimed is:

1. A microelectronic structure comprising:
   a substrate layer;
   a silicon-based dielectric layer;
   two conductive layers crossing between the substrate layer and dielectric layer and being separated from each other by a void;

wherein the silicon-based dielectric layer is in immediate contact with a top surface of each of the two conductive layers and at least partially defines the void;

wherein substantially none of the dielectric layer is in contact with side walls of the two conductive layers; and wherein the silicon-based dielectric layer defines a void apex at a position substantially equidistant from the two conductive layers.

2. The microelectronic structure of claim 1 wherein the void apex is positioned farther from the substrate layer than any portion of the two conductive layers.

3. A microelectronic structure comprising:
a substrate layer;
a silicon-based dielectric layer;
two conductive layers crossing between the substrate layer and dielectric layer and being separated from each other by a void;
wherein the silicon-based dielectric layer is in immediate contact with a toy surface of each of the two conductive layers and at least partially defines the void;
wherein the silicon-based dielectric layer defines a void apex at a position substantially equidistant from the two conductive layers;
wherein the void apex is positioned farther from the substrate layer than any portion of the two conductive layers; and
wherein the void apex substantially bisects two convex surfaces of the silicon-based dielectric layer, the two convex surfaces partially defining the void.

4. The microelectronic structure of claim 3 wherein a top boundary of the void is substantially entirely defined by the dielectric layer.

5. The microelectronic structure of claim 4, wherein the first and second conductive layers have substantially the same height and are separated by an interlayer gap with a width, the height of the first and second conductive layers and the width of the interlayer gap defining an aspect ratio which is greater than about 1.0, and wherein the interlayer gap is less than about 500 nanometers.

6. The microelectronic structure of claim 5 wherein the dielectric layer has a minimum thickness above the first and second conductive layers greater than about 0.87 times the width of the interlayer gap.

7. The microelectronic structure of claim 6 wherein the dielectric layer has a minimum thickness greater than about 215 nanometers, and the interlayer gap is about 250 nanometers.

8. The microelectronic structure of claim 3 wherein the dielectric layer is a silicon-based dielectric layer deposited using low-temperature PECVD with a silane precursor.

9. The microelectronic structure of claim 3 wherein the two conductive layers have substantially the same height and are separated by an interlayer gap, the height and interlayer gap defining an aspect ratio which is at least about 2.0.

10. The microelectronic structure of claim 3 wherein the two conductive layers have substantially the same height and are separated by an interlayer gap, the height and interlayer gap defining an aspect ratio which is at least about 3.0.

11. A microelectronic structure comprising:
a substrate layer;
a silicon-based dielectric layer;
two conductive layers between the substrate layer and dielectric layer and being separated from each other by a void;
an isolation layer on each of the two conductive layers and in immediate contact with each of the two conductive layers, positioned between each of the two conductive layers and the void, and between each of the two conductive layers and the silicon-based dielectric layer;
wherein the silicon-based dielectric layer is in immediate contact with a top surface of the isolation layer and at least partially defines the void;
wherein the dielectric layer comprises an apex joint, at which two surfaces of the dielectric layer meet between the first and second conductive layers, the apex joint being farther from the substrate layer than any portion of the first and second conductive layers; and
wherein substantially none of the dielectric layer is in contact with side walls of the isolation layer.

12. The microelectronic structure of claim 11 wherein the two conductive layers have substantially the same height and are separated by an interlayer gap, the height and interlayer gap defining an aspect ratio which is greater than about 2.0, and wherein the interlayer gap is less than about 500 nanometers.

13. The microelectronic structure of claim 12 wherein the silicon-based dielectric material has a minimum thickness greater than about 0.87 times the width of the interlayer space.

14. The microelectronic structure of claim 11 wherein the silicon-based dielectric layer is deposited using low-temperature PECVD with a silane precursor.

15. The microelectronic structure of claim 11 wherein the silicon-based dielectric material comprises one from the group consisting of silicon oxynitride, silicon dioxide, and silicon nitride.

16. The microelectronic structure of claim 11 wherein the isolation layer has a thickness less than about 200 nanometers.

* * * * *